(12) United States Patent
Weizman et al.

(10) Patent No.: US 9,619,904 B2
(45) Date of Patent: Apr. 11, 2017

(54) EXPLOITING SIMILARITY IN ADJACENT SLICES FOR COMPRESSED SENSING MRI

(71) Applicants: Technion Research & Development Foundation Limited, Haifa (IL); THE MEDICAL RESEARCH, INFRASTRUCTURE AND HEALTH SERVICES FUND OF THE TEL-AVIV MEDICAL CENTER, Tel-Aviv (IL)

(72) Inventors: Lior Weizman, Jerusalem (IL); Yonina Eldar, Haifa (IL); Dafna Ben Bashat, Tel-Aviv (IL)

(73) Assignees: Technion Research & Development Foundation Limited, Haifa (IL); The Medical Research, Infrastructure and Health Services Fund of the Tel-Aviv Medical Center, Tel-Aviv (IL)

( * ) Notice: Subject to any disclaimer, the term of this patent is extended or adjusted under 35 U.S.C. 154(b) by 37 days.

(21) Appl. No.: 14/835,754

(22) Filed: Aug. 26, 2015

(65) Prior Publication Data
US 2016/0063739 A1 Mar. 3, 2016

Related U.S. Application Data

(60) Provisional application No. 62/041,784, filed on Aug. 26, 2014.

(51) Int. Cl.
*G06K 9/00* (2006.01)
*G06T 11/00* (2006.01)
(Continued)

(52) U.S. Cl.
CPC ........ *G06T 11/003* (2013.01); *G01R 33/4835* (2013.01); *G01R 33/561* (2013.01); *G01R 33/5602* (2013.01); *G01R 33/5608* (2013.01)

(58) Field of Classification Search
USPC ........ 382/100, 103, 106–107, 128–133, 154, 382/162, 168, 173, 181, 199, 232, 254,
(Continued)

(56) References Cited

U.S. PATENT DOCUMENTS

| 2008/0108894 A1* | 5/2008 | Elgavish | G06T 7/0012 600/420 |
| 2010/0128950 A1* | 5/2010 | Woods | G06K 9/3233 382/131 |

(Continued)

OTHER PUBLICATIONS

Inamuro et al., Improving the quality of compressed sensing MRI that exploits adjacent slice similarity; Proceedings of APSIPA Annual Summit and Conference 2015, Dec. 16-19, 2015 (6 pages).
Inamuro et al., Compressed sensing MRI using sparsity induced from adjacent slice similarity, 978-1-4673-7353-1/15/ © 2015 IEEE(5 pages).

(Continued)

*Primary Examiner* — Seyed Azarian
(74) *Attorney, Agent, or Firm* — Roach Brown McCarthy & Gruber, P.C.; Kevin D. McCarthy

(57) ABSTRACT

A method for reconstructing high signal-to-noise ratio (SNR) magnetic resonance imaging (MRI) slices, including: receiving a thick MRI slice of bodily tissue acquired using a single MRI scan, wherein the thick slice has a high SNR; receiving two thin MRI slices of the bodily tissue acquired using a single MRI scan, wherein each of the two thin MRI slices has a low SNR; and reconstructing multiple high SNR thin slices of the bodily tissue using the thick slice and the two thin slices.

33 Claims, 7 Drawing Sheets

(51) Int. Cl.
  *G01R 33/483* (2006.01)
  *A61B 5/05* (2006.01)
  *G01R 33/56* (2006.01)
  *G01R 33/561* (2006.01)

(58) Field of Classification Search
  USPC ........ 382/274–276, 285–286, 291, 305, 312,
    382/219; 600/420, 410; 378/4, 21
  See application file for complete search history.

(56) References Cited

U.S. PATENT DOCUMENTS

| | | | | |
|---|---|---|---|---|
| 2010/0329528 | A1* | 12/2010 | Hajnal | A61B 5/055 382/131 |
| 2011/0019935 | A1* | 1/2011 | Kelm | G06T 5/50 382/275 |
| 2011/0275926 | A1* | 11/2011 | Du | G01R 33/5635 600/410 |

OTHER PUBLICATIONS

Pang Y, Zhang X (2013) Interpolated Compressed Sensing for 2D Multiple Slice Fast MR Imaging. PLoS ONE 8(2): e56098. doi:10.1371/ journal.pone.0056098 (5 pages).

Bilgic et al., Multi-contrast Reconstruction With Bayesian Compressed Sensing, Magnetic Resonance in Medicine 66:1601-1615 (2011) (15 pages).

Lustig et al., Compressed Sensing MRI, IEEE Signal Processing Magazine [72] Mar. 2008 (11 pages).

Weizman et al., Exploiting Similarity in Adjacent Slices for Compressed Sensing MRI, 978-1-4244-7929-0/14/ © 2014 IEEE (4 pages).

Gamper et al., Compressed Sensing in Dynamic MRI, Magnetic Resonance in Medicine 59:365-373 (2008) (9 pages).

Haldar et al., Improved Diffusion Imaging Through SNR-Enhancing Joint Reconstruction, Magnetic Resonance in Medicine 69:277-289 (2013) (13 pages).

Weizman et al., Fast Reference Based MRI, IEEE Transactions on Medical Imaging, vol. XX, No. XX (2015) (8 pages).

* cited by examiner

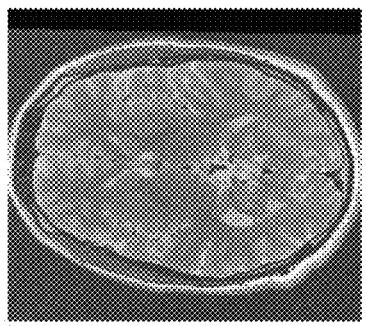
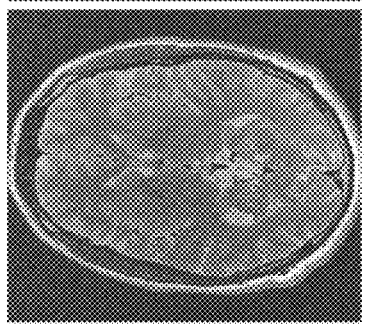
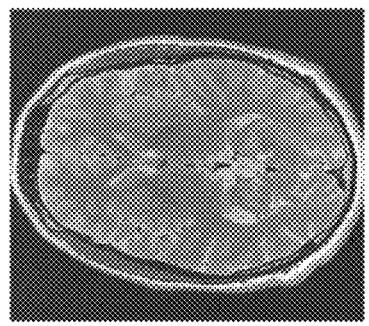
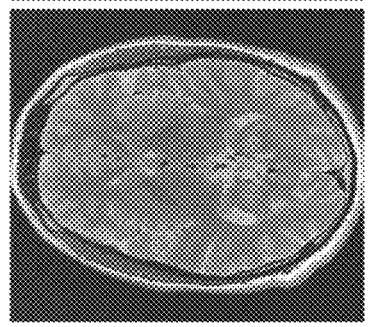
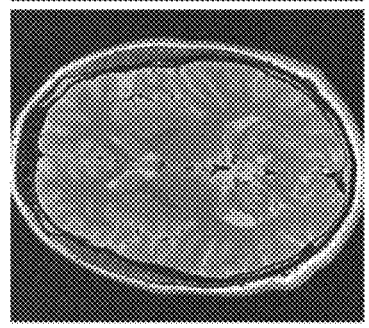

EXPLOITING SIMILARITY IN ADJACENT SLICES FOR COMPRESSED SENSING MRI

CROSS-REFERENCE TO RELATED APPLICATIONS

This application claims the benefit of U.S. Provisional Patent Application No. 62/041,784, filed Aug. 26, 2014 and entitled "Exploiting Similarity in Adjacent Slices for Compressed Sensing MRI", the contents of which are incorporated herein by reference in their entirety.

BACKGROUND

The invention relates to the field of magnetic resonance imaging (MRI).

MRI is the method of choice for clinical brain imaging, as it involves no exposure to ionizing radiation and provides high quality imaging for soft tissue. Conventional clinical MRI scan may last up to one hour and consists of multiple imaging contrasts of the same region. Radiologists may to detect subtle abnormalities, such as a developing tumor, by comparing multiples images of the same region and examining the variations in contrast of the different tissue types. However, the scanning procedure in MRI is time-consuming, resulting in patients spending prolonged times inside the machine.

A previously acquired image may serve as a reference image to shorten acquisition time and/or to improve Signal to Noise Ratio (SNR), by exploiting a degree of similarity between the reference and acquired image. For example, similarity may exist between adjacent slices in high resolution MRI, between various contrasts in the same scans, and between different scans of the same patient.

MRI data is typically sampled in the spatial Fourier transform ('k-space') of the object under investigation. Due to constraints in the implementation of the k-space trajectory that controls the sampling pattern, the k-space may be sampled below the minimum rate at which a signal can be sampled without introducing errors, the Nyquist rate. For example, acquisition duration, scheme, smoothness of gradients can pose such sampling constraints. Prior assumptions on the nature of the data may be used to reconstruct higher quality images from the sparsely sampled images, such as to overcome any imaging artefacts introduced due to insufficient sampling.

Furthermore, MR images are highly compressible, and the image reconstruction problem may be formalized as an $l_1$ minimization problem. These sparse MRI reconstruction approaches fall into two general categories: single- and multiple-image sparsity-based reconstruction.

The first category exploits the sparsity of a single MRI image in some transform domain. Wavelet transforms are widely used as a sparsifying transform for brain images, whereas total variation (TV) are generally used for angio-MRI. Other approaches focus on sparsifying transform learning techniques, or use a dictionary developed exclusively for MRI. However, these approaches may suffer from artefacts in cases of severe undersampling.

The second category exploits the similarity within a series of MRI images. In dynamic imaging, MRI images are acquired at a high frame rate and sparsity may be introduced by applying a Fourier transformation along the temporal dimension, assuming that only parts of the field-of-view (FOV) change at a high temporal rate, as described in U. Gamper et al., "Compressed sensing in dynamic MRI," Magnetic Resonance in Medicine, vol. 59, no. 2, pp. 365-373, 2008. Other techniques represent dynamic MRI as a superposition of a low-rank background component and a sparse dynamic component. In multiple-contrast MRI, structural similarity is assumed between contrasts, and sparsity is enforced on the difference between gradient images having different imaging contrast, as described in Berkin Bilgic, Vivek K Goyal, and Elfar Adalsteinsson, "Multi-contrast reconstruction with bayesian compressed sensing," Magnetic Resonance in Medicine, vol. 66, no. 6, pp. 1601-1615, 2011.

Since similarity between multiple images takes different forms, a different sparsity-based reconstruction is typically used for different MRI applications, exploiting the specific sparsity characteristics of each application. However, assuming substantial similarity between the images in the series, in the image domain or in some transform domain may not always be valid and may lead to undesired reconstruction results.

Other high resolution MRI applications suffer from low Signal to Noise Ratio (SNR) and require multiple scanning repetitions to yield an adequate SNR, which may double or triple the total scanning time. Improvements to the hardware and/or the acquisition process may improve the SNR in these cases.

The foregoing examples of the related art and limitations related therewith are intended to be illustrative and not exclusive. Other limitations of the related art will become apparent to those of skill in the art upon a reading of the specification and a study of the figures.

SUMMARY

The following embodiments and aspects thereof are described and illustrated in conjunction with systems, tools and methods which are meant to be exemplary and illustrative, not limiting in scope.

There is provided, in accordance with an embodiment, a method for reconstructing high signal-to-noise ratio (SNR) magnetic resonance imaging (MRI) slices, comprising: receiving a thick MRI slice of bodily tissue acquired using a single MRI scan, wherein the thick slice has a high SNR; receiving two thin MRI slices of the bodily tissue acquired using a single MRI scan, wherein each of the two thin MRI slices has a low SNR; and reconstructing multiple high SNR thin slices of the bodily tissue using the thick slice and the two thin slices.

There is provided in accordance with an embodiment, a system for reconstructing high signal-to-noise ratio (SNR) magnetic resonance imaging (MRI) slices, comprising: an MRI imaging system; and a processor, wherein the processor is configured to receive a thick MRI slice of bodily tissue acquired using a single scan by the MRI imaging system, wherein the thick slice has a high SNR; receive two thin MRI slices of the bodily tissue acquired using a single scan by the MRI imaging system, wherein each of the two thin MRI slices has a low SNR; and reconstruct multiple high SNR thin slices of the bodily tissue using the thick slice and the two thin slices.

There is provided, in accordance with an embodiment, a computer program product comprising a non-transitory computer-readable storage medium having program code embodied thereon, the program code executable by at least one hardware processor to: receive a thick MRI slice of bodily tissue acquired using a single MRI scan, wherein the thick slice has a high SNR; receive two thin MRI slices of the bodily tissue acquired using a single MRI scan, wherein each of the two thin MRI slices has a low SNR; and reconstruct multiple high SNR thin slices of the bodily tissue using the thick slice and the two thin slices.

In some embodiments, the thick MRI slice overlaps each of the two thin MRI slices.

In some embodiments, the two thin MRI slices are adjacent.

In some embodiments, the bodily tissue is a brain.

In some embodiments, the thin slices each has a thickness in the order of 0.8 millimeters, and the thick slice has a thickness in the order of 1.6 millimeters, and wherein an in-plane resolution of the acquisitions is in the order of 0.8 by 0.8 millimeters squared.

In some embodiments, reconstructing comprises assigning higher weights to elements corresponding to the thick MRI slice and lower weights to elements corresponding to the thin MRI slices, thereby prioritizing acquired MRI slices having high SNR.

In some embodiments, the weights are determined in real-time while acquiring the thick and thin MRI slices.

In some embodiments, the weights enforce a sparsity on the differences between the thin MRI slices.

In some embodiments, acquiring the thick slice and the two thin slices comprises sampling over an entire spatial transform corresponding to the bodily tissue.

In some embodiments, reconstructing comprises enforcing a similarity attribute between the thick slice and an average of the two thin slices.

In some embodiments, reconstructing comprises optimizing one or more parameters of an $l_1$ minimization problem corresponding to reconstructing the high SNR thin slices.

In some embodiments, the method further comprises, or the program code is further executable for, rendering the reconstructed SNR thin slices on a display monitor.

In some embodiments, the system further comprises a display monitor configured to display the reconstructed multiple high SNR thin slices.

In addition to the exemplary aspects and embodiments described above, further aspects and embodiments will become apparent by reference to the figures and by study of the following detailed description.

BRIEF DESCRIPTION OF THE FIGURES

Exemplary embodiments are illustrated in referenced figures. Dimensions of components and features shown in the figures are generally chosen for convenience and clarity of presentation and are not necessarily shown to scale. The figures are listed below.

FIGS. 5A-F show pairs of adjacent thin T2-weighted slices that were acquired with varying repetitions;

FIGS. 5G-H show a reconstruction using FIGS. 5A-B and a high SNR thick slice (not shown) using the method of FIGS. 1A-B, in accordance with an embodiment.

DETAILED DESCRIPTION

Figure 1A:
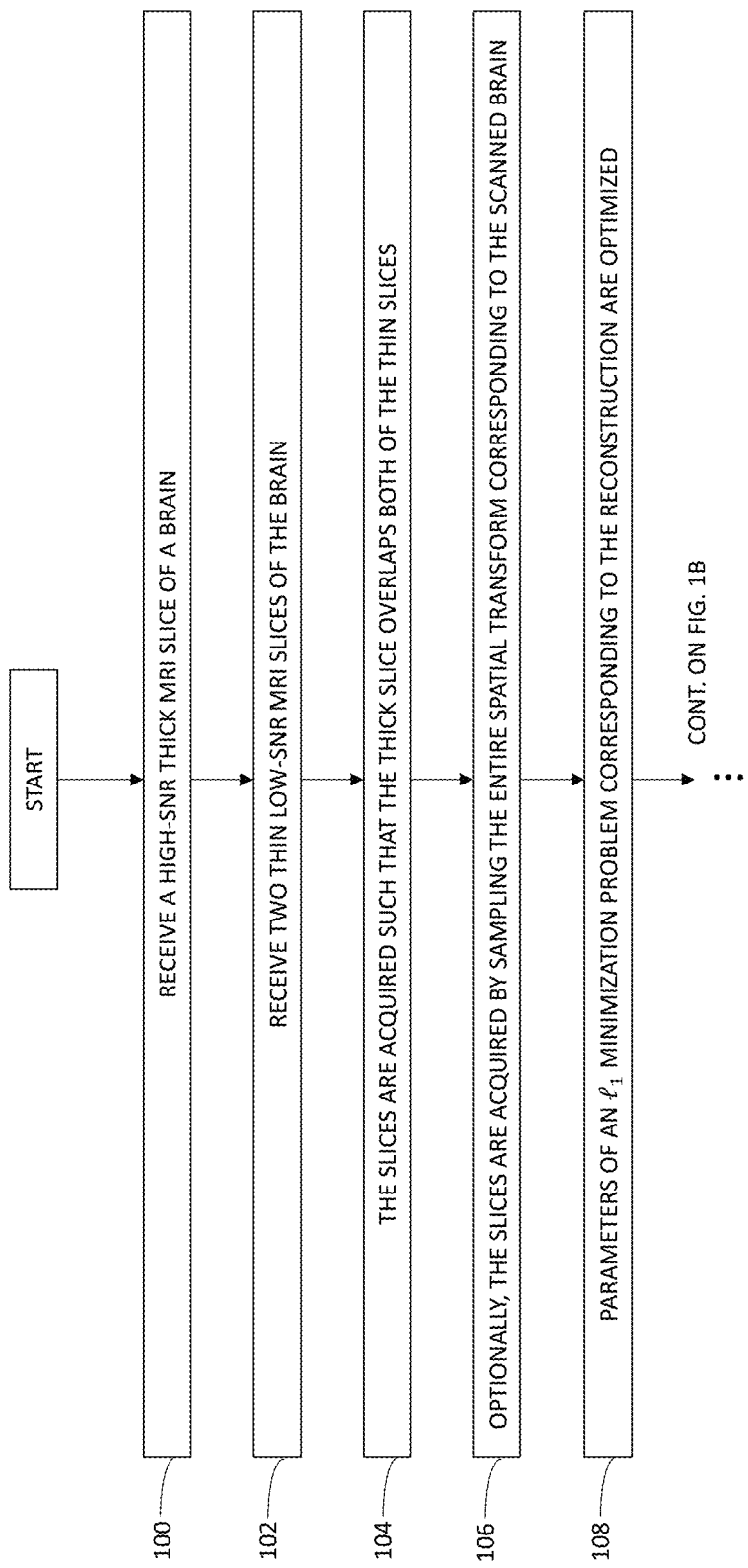
FIGS. 1A-B, together, are a flowchart for a method for reconstructing multiple high SNR MRI slices.

A system and method are disclosed herein for fast MRI image reconstruction that utilizes weighted similarity to reference images. Since a reference MRI image may exhibit varying similarity with multiple different acquired images, the reconstruction uses an iterative weighted approach to tune the weights according to the respective degree of similarity.

SNR is typically proportional to the number of protons involved in generating a measured signal, and thus, thick slices typically provide better SNR than thin slices. To provide high SNR MRI, scans consisting of thin slices averaged over several repetitions are required.

Thus, instead of undersampling the k-space and compromising on image quality, scanning time may be shortened by reducing the number of scanning repetitions. Similarity between the scanned thin slices and/or similarity to a high SNR image slice may be used for reconstructing multiple thin slices. In one embodiment, a combination of multiple low SNR thin slices and an overlapping, high SNR thick slice are used to reconstruct multiple high SNR thin slices.

The iterative weighted technique that adjusts the reconstruction parameters and the sampling locations during real-time scanning is described in the context of evaluating a follow-up MRI, given a baseline scan of the same patient, while taking into account that the baseline image and follow-up images may or may not exhibit similarity. The advantage of optimizing the parameters during the reconstruction process may increase matching of the $l_1$ model to the measurements. This improvement is demonstrated in the experimental results, below.

Furthermore, enforcing sparsity on the difference between adjacent thin MRI slices, together with combining data from thin, low-SNR slices, thin, high SNR slices may be obtained, obviating the need for multiple repetitions with high SNR. This may be implemented by modifying the radio frequency (RF) pulse signal for the different weightings of the thin slices in the acquired data.

A general "fast reference based MRI" scheme introduced herein may be used to shorten the acquisition time for many MRI applications in which a reference image, known in advance, is available. This reference image may exhibit some degree of similarity with the data that is subsequently acquired. This scheme is a general scheme that may be suitable to a variety of clinical imaging scenarios where supplemental imaging information is available, and that is typically neglected due to its low fidelity.

The method may account for cases where similarity is not guaranteed and/or not provided in full coverage. For example, in many clinical scanning protocols, both T2-weighted and fluid-attenuated inversion recovery (FLAIR) contrasts are fully sampled. However, images obtained using these protocols exhibit similarities only in regions with low fluid concentration. In addition, follow-up scans of the same patient are regularly obtained as part of clinical disease monitoring. The acquisition time of these follow-up scans may be shortened by using previously acquired scans of the same patient, and need to be taken into account.

The application of compressed sensing (CS) for MRI exploits the fact that MRI scans are typically sparse in some transform domain, which is incoherent with the sampling domain. Nonlinear reconstruction is then used to enforce both sparsity of the image representation in some transform domain and consistency with the acquired data. A typical formulation of CS MRI recovery aims to solve the following constrained optimization problem:

$$\min_x \|\Psi x\|_1 \text{ s.t. } \|F_u x - y\|_2 < \varepsilon \qquad (1)$$

where $x \in \mathbb{C}^N$ is the N-pixel complex image to be reconstructed, represented as a vector, $y \in \mathbb{C}^M$, represents the k-space measurements, $F_u$ is the undersampled Fourier transform operator, $\Psi$ is a sparsifying transform operator and $\varepsilon$ controls the fidelity of the reconstruction to the measured data. Since brain MRI are known to be sparse in the wavelet domain, $\Psi$ may be assumed as an appropriately chosen wavelet transform.

In many cases, CS-MRI is solved in its so-called Lagrangian form, where $\lambda$ is a properly chosen regularization parameter:

$$\min_x \|F_u x - y\|_2^2 + \lambda \|\Psi x\|_1 \qquad (2)$$

However, this basic formulation does not take into account any image-based prior information that may be available.

In many MRI imaging scenarios, an a-priori image or "reference image" represented as $x_0$ that may exhibit similarity to the acquired image is available. A reference image could be a different imaging contrast in the same scan, an adjacent image slice or a previous scan of the same patient. In some imaging applications, it may be assumed that $x_0$ and x are similar in most image regions. Therefore the difference between them, $x-x_0$ can be modeled as sparse, and a CS-based optimization may utilize the reference image for improved reconstruction via $l_1$ minimization. Such a reference-based compressed sensing takes into account the fidelity of the measurements and the similarity to the reference scan, and the CS-based optimization may be formulated as follows:

$$\min_x \|F_u x - y\|_2^2 + \lambda \|x - x_0\|_1 \qquad (3)$$

This optimization problem assumes high degree of similarity between $x_o$ and x, and may be suitable for dynamic MRI. The following general framework for reference based MRI accounts for the fact that $x_o$ may exhibit differences with respect to x. Additionally, since not all the samples in y have the same SNR, high SNR over may be prioritized over low SNR samples in the reconstruction process. This approach is based on enforcing similarity between x and $x_o$ via weighted $l_1$ norm, as follows:

$$\min_x \|A(F_u x - y)\|_2^2 + \lambda_1 \|W_1 \Psi x\|_1 + \lambda_2 \|W_2 (x - x_o)\|_1 \qquad (4)$$

where A is a diagonal matrix that controls the weight given to the fidelity of certain measurements (used to prioritize samples with high SNR). The matrices $W_1$ and $W_2$ are weighting matrices, where $W_k = \text{diag}([w_k^1, w_k^2, \ldots, w_k^N])$ with $0 \le w_k^i \le 1$, that control the weight given to each element in the sparse representation.

In particular, $W_1$ may be used to weight specific wavelet atoms in the reconstruction process and $W_2$ may be used to weight image regions according to their similarity level with the reference scan. The parameters $\lambda_1$ and $\lambda_2$ are regularization parameters that control the weight given to each respective term in the optimization problem. In most cases, the expected SNR of the acquired data is known and the matrix A can be determined in advance. In cases where neither the similarity to the reference image nor the support in the wavelet domain are known in advance, weighting matrices $W_1$ and $W_2$ may be determined during the acquisition process, which is described in greater detail below.

Since the similarity of x to $x_o$, as well as the support of x in the wavelet domain are unknown, matrices $W_1$ and $W_2$ may be estimated from the acquired data in an adaptive fashion. An iterative algorithm may add one or more k-space samples to the reconstruction process in each iteration, and priority may be given to samples closer to the origin of the k-space. An image $\hat{x}$ may be estimated to serve as a basis for estimating the weighting matrices in the next iteration. The rational behind the iterative computation of $W_k$ is as follows: for $W_1$, the demand for sparsity on elements in the support of $\Psi x$ may be relaxed. For $W_2$, sparsity may be enforced only in spatial regions where $x \approx x_o$. Since x is unknown, $\hat{x}$, which is updated in every iteration, may be used in place of x. Therefore, the elements of the weighting matrices may be chosen as follows:

$$w_1^i = \frac{1}{1 + [|\Psi \hat{x}|]_i}$$

$$w_2^i = \frac{1}{1 + [|\hat{x} - x_0|]_i} \qquad (5)$$

where $[\cdot]_i$ denotes the $i^{th}$ element of the vector in brackets, and the weights in equations (5) are given values that vary between 0 and 1. The values for $w_1^i$ and $w_2^i$ are inversely proportional to the values of the corresponding elements in the vectors $\Psi x$ and $\hat{x}-x_0$, respectively.

In one embodiment, an image $\hat{x}$ may be estimated according to Algorithm 1, an exemplary implementation of which is given below, where similarity is not assumed with the reference image, and thus $W_1=1$ and $W_2=0$.

---

Algorithm 1:

---

Input:
    the number of iterations: $N_1$; a reference image $x_0$; sampled k-space: z;
    tuning constants $\lambda_1, \lambda_2$; a number of k-space samples added at each
    iteration $N_k$; and an expected fidelity of measurements A.
Output: Estimated image: $\hat{x}$:
Initialize $W_1 = I$, $W_2 = 0$.
Perform the reconstruction:
    For $l = 1$ to $N_1$ perform the following steps:
      i) Add $N_k$ new samples to y from z according to their respecitve distance from the center of k-space.
      ii) Perform a weighted reconstruction by estimating $\hat{x}$ by solving equation (4)
      iii) Update weights $W_1$ and $W_2$ according to equation (5)
End.

---

To solve the $l_1$-minimization problem of equation (4) in the weighted reconstruction phase, an extension of SFISTA as described in Zhao Tan, Yonina C Eldar, Amir Beck, and Arye Nehorai, "Smoothing and decomposition for analysis sparse recovery," IEEE Transactions on Signal Processing, vol. 62, no. 7, pp. 1762-1774, 2014, may be used.

The extended algorithm may be summarized in Algorithm 2 as follows, where the notation$[\cdot]_2$ for matrices denotes the largest singular value.

---
Algorithm 2:

---
Input:
  k-space measurements: y;
  Sparsifying transform operator: $\Psi$
  An N × N k-space undersampling operator: $F_u$
  Reference image: $x_0$
  Expected fidelity of measurements: A
  Tuning constants: $\lambda_1, \lambda_2, \mu$ An upper bound: $L \geq \|AF_u\|_2^2 + \dfrac{\|W_1\Psi\|_2^2 + \|W_2\|_2^2}{\mu}$ Output: Estimated image: $\hat{x}$
Initialize: $x_1 = z_2 = F_u^* y, t_2 = 1$
Iterations:
  Step k: (k ≥ 2) Compute
  $\nabla f(z_k) = A^*(F_u^*(A(F_u z_k - y)))$ $\nabla g_{1\mu}(W_1\Psi x_{k-1}) = \dfrac{1}{\mu} W_1 \Psi^*(W_1\Psi x_{k-1} - \Gamma_{\lambda_1\mu}(W_1\Psi x_{k-1}))$ $\nabla g_{2\mu}(W_2(x_{k-1} - x_0)) = \dfrac{1}{\mu} W_2(W_2(x_{k-1} - x_0) - \Gamma_{\lambda_2\mu}(W_2(x_{k-1} - x_0)))$ $x_k = z_k - \dfrac{1}{L}(\nabla f(z_k) + \nabla g_{1\mu}(W_1\Psi x_{k-1}) + \nabla g_{2\mu}(W_2(x_{k-1} - x_0)))$ $t_{k+1} = \dfrac{1 + \sqrt{1 + 4t_k^2}}{2}$ End.

---

The operator $\Gamma_{\lambda,\mu}(z)$ is the soft shrinkage operator, which operates element-wise on z and is defined, for complex valued $z_i$, as:

$$\Gamma_{\lambda\mu}(z_i) = \begin{cases} \dfrac{|z_i| - \lambda\mu}{|z_i|} z_i, & |z_i| > \lambda\mu \\ 0, & \text{otherwise,} \end{cases} \quad (6)$$

Algorithm 2 described above minimizes equation (4), where the trade-off between the two sparsity assumptions is controlled by the ratio between $\lambda_1$ and $\lambda_2$, via $\Gamma(\cdot)$, and the overall convergence is controlled by $\mu$.

In one exemplary implementation, a single repetition may be used to acquire two thin adjacent slices $x_1$ and $x_2$ having a low SNR, and a single thick slice, $x_3$ that spatially overlaps $x_1$ and $x_2$, where the goal is to improve the SNR of $x_1$ and $x_2$ by accounting for the similarity between the thin adjacent slices $x_1$ and $x_2$ and the high-SNR, thick slice, $x_3$.

The k-spaces of two thin slices and the corresponding thick slice may be represented by $y=[y_1, y_2, y_3]^T$, corresponding to $[x_1, x_2, x_3]$, respectively. Since a thick slice consists of averaged values of the thin slices, the two thin slices $x_1$ and $x_2$ and one thick slice $x_3$ may be denoted as $$x = [x_1, x_2, 0.5(x_1+x_2)]^T \quad (7)$$

The matrix A may be determined by the estimated SNR of the elements in y, where higher values may be assigned to elements corresponding to the thick slices $y_3$ in accordance with their higher SNRs, and lower values may be assigned to elements corresponding to $y_1$ and $y_2$, in accordance with their lower SNRs. Similarity may be enforced between the thin slices, and equation (2) may be reformulated as follows:

$$\min_x \|A(F_3 x - y)\|_2^2 + \lambda_1 \|W_1 \Psi_3 x\|_1 + \lambda_2 \|W_2 B x\|_1 \quad (8)$$

Here $F_3 = [F, F, F]$, $\Psi_3 = [\Psi, \Psi, \Psi]$ and $B = \text{diag}\left(\left[\underbrace{1, \ldots, 1}_{N \text{ times}} \quad \underbrace{-1, \ldots, -1}_{N \text{ times}} \quad \underbrace{0, \ldots, 0}_{N \text{ times}}\right]\right).$ It may be noted that similarity between the thick slice and the average of the thin slices is enforced in the Fourier domain via the leftmost term of Eq. (8). Algorithm 1 and Algorithm 2 may be suitably adapted to solve (8) in iterative manner using known techniques.

Figure 1B:
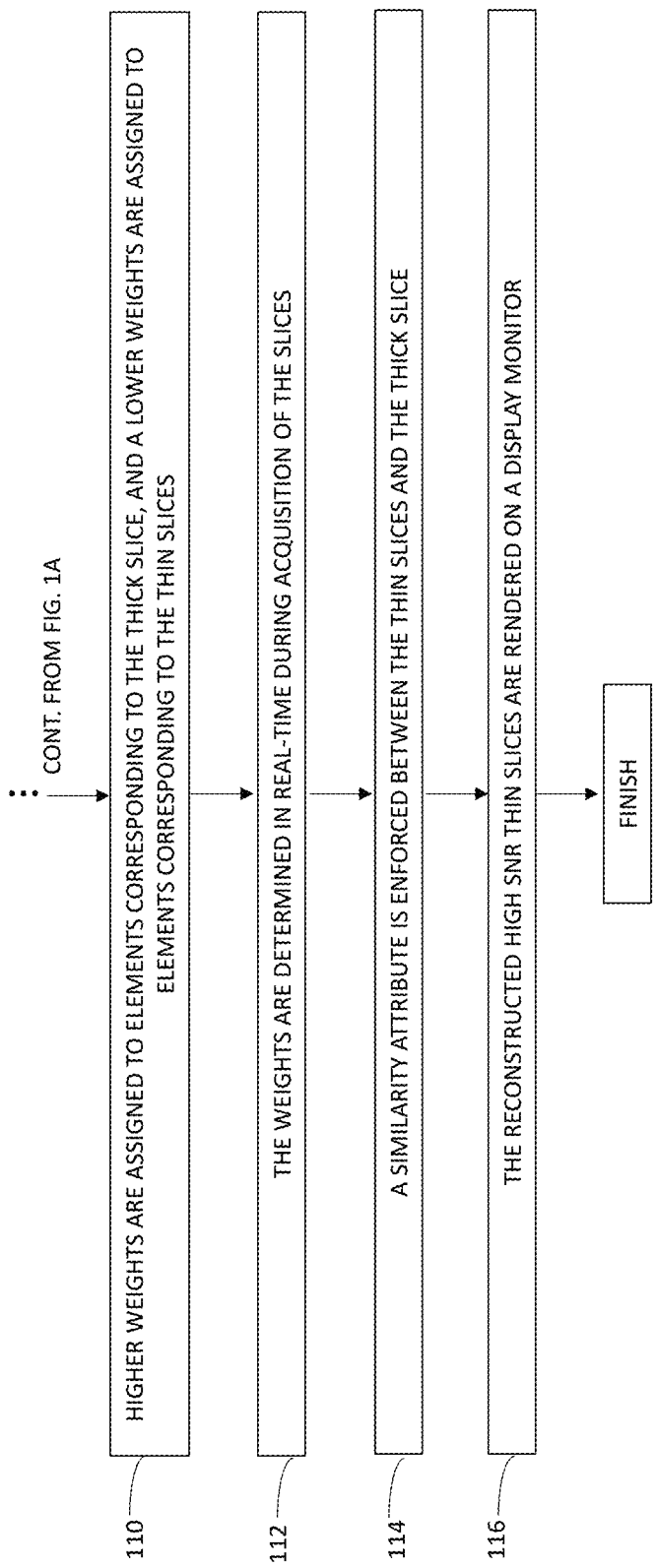

Reference is now made to FIGS. 1A-B which together are a flowchart of a method for reconstructing multiple high SNR MRI slices. A thick MRI slice of a bodily tissue such as the brain acquired using a single MRI scan, is received, where the thick slice has a high SNR (Step 100). Two thin MRI slices of the bodily tissue, each acquired using a single MRI scan, are received, where each thin slice has a low SNR (Step 102). The slices may be acquired such that the thick MRI slice overlaps each of the two thin MRI slices (Step 104). The thick slice and the two thin slices may be acquired at a sampling rate that below, at, or exceeds the Nyquist rate for the slices, thereby avoiding under-sampling and compromising on image quality. The thick slice and the two thin slices may be acquired by sampling over the entire spatial transform corresponding to the bodily tissue (Step 106).

Multiple high SNR thin slices of the bodily tissue are reconstructed using the thick slice and the two thin slices by performing the following steps: the reconstruction may comprise optimizing one or more parameters of an $l_1$ minimization problem corresponding to the reconstruction (Step 108). The optimizing may comprise assigning higher weights to elements corresponding to the thick MRI slice and lower weights to elements corresponding to the thin MRI slices, to prioritize the higher SNR slices (Step 110). The weights may be determined in real-time during the acquisition of the slices (Step 112), and may enforce a sparsity on the differences between the thin MRI slices. The reconstruction may further comprise enforcing a similarity attribute between the thick slice and an average of the two thin slices (Step 114). The reconstructed high SNR thin slices may be rendered on a display monitor (Step 116).

Figure 2:
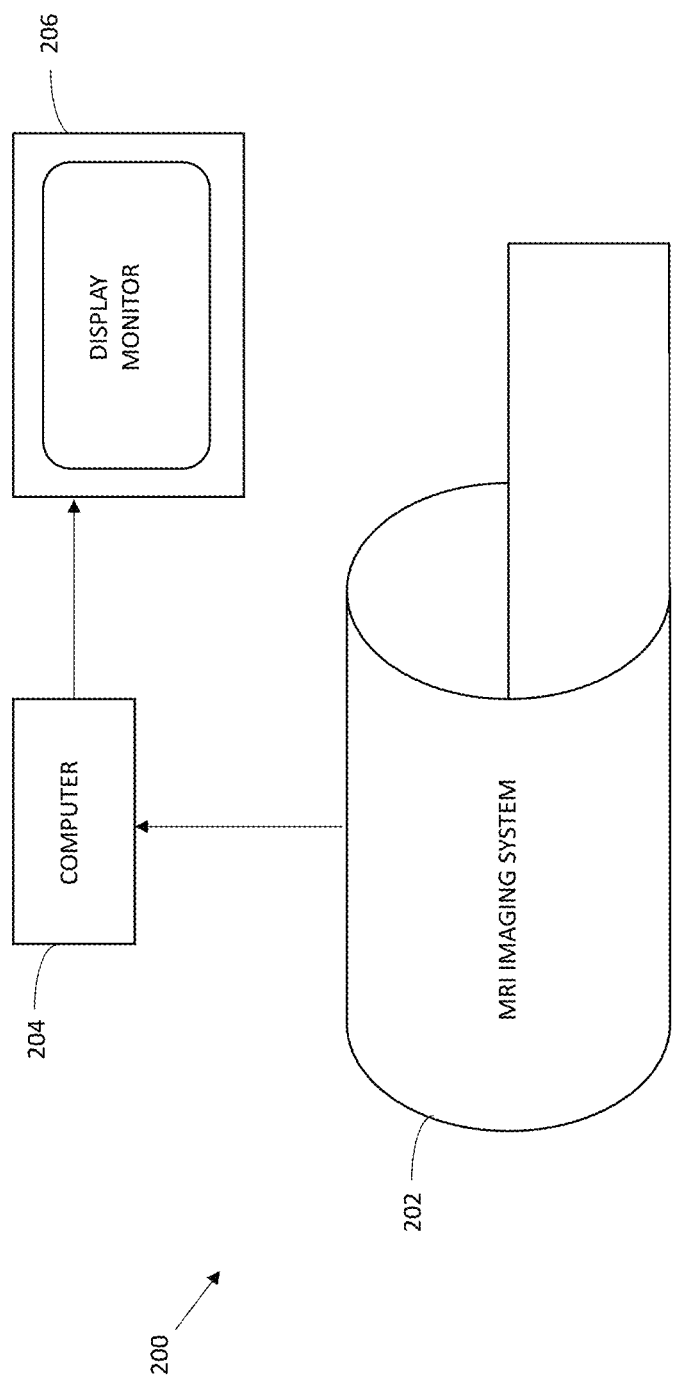
FIG. 2 shows an apparatus for implementing the method described in FIGS. 1A-B.

Reference is now made to FIG. 2 which shows an apparatus 200 for implementing the method described above. The apparatus may include an MRI imaging system 202, connected to a computer 204 that receives one or more acquired images, such as one thick, high-SNR MRI slice and two, adjacent thin, low-SNR MRI slices from imaging system 200. Computer 204 reconstructs multiple high SNR thin slices from the received images using any of the methods described herein, and renders the reconstructed images on a display monitor 206. Any elements of apparatus 200, in particular, MRI imaging system 202, computer 204, and display monitor 206 may communicate with each other using any suitable wired and/or wireless communications means and protocol.

Experimental Results

To demonstrate the performance of the reference-based MRI reconstruction approach described above, three MRI applications, all of which utilize a reference scan for improved reconstruction, were examined. Where relevant, partial k-space acquisition was obtained by down-sampling a fully sampled k-space. A Daubechies 4 wavelet transform was used as the sparsifying transform. Different values of $\lambda_1$, $\lambda_2$ in the range of [0.001, 0.9] were examined, and the best result in terms of image quality is presented in each case. The threshold for defining similarity in the sparse transform domain was set to $\epsilon=0.1$. All scans were performed on a GE Signa 1.5T HDx scanner. High SNR images reconstructed from fully sampled data serve as gold standard. The source code and data required to reproduce the results presented herein may be downloaded from: http://www.technion.ac.il/weizmanl/software The first application exploits similarity between two different imaging contrasts for fast scanning of one of them utilizing similarity between T2-weighted and fluid-attenuated inversion recovery (FLAIR) for fast FLAIR scanning. The second application exploits similarity between different scans of the same patient for fast scanning of follow-up scans, and the third application exploits similarity between adjacent slices to improve SNR within the same imaging contrast. These Experiments demonstrate the performance of the method in three different clinical MRI scenarios: SNR improvement in high resolution brain MRI, and utilizing similarity between baseline and follow-up scans for fast follow-up scanning.

1. Utilizing Similarity Between T2-Weighted and FLAIR

In this experiment, the goal was to reconstruct a FLAIR image, x, from undersampled measurements, utilizing similarity to T2-weighted image. Images were acquired with an in-plane resolution of 0.5×0.5 mm$^2$ and with slice thickness of 4 millimeters (mm). Only 15% of the FLAIR k-space were sampled with variable density random sampling and a fully sampled T2-weighted scan was used as the reference image ($x_0$). Since all samples were acquired with similar SNR, A=I.

FLAIR and T2-weighted scans are known to exhibit high similarity in regions with low fluid concentration. Therefore, while $W_2$ can be computed iteratively as described in Algorithm 1, it is possible to save time in the reconstruction process by utilizing this piece of information. This can be done by giving low values to elements in $W_2$ corresponding to pixels with high fluid concentration and 1 to others. The regions with high fluid concentration can be easily detected by their high intensity values in the reference, T2-weighted image.

Figures 3A, 3B, 3C, 3D:
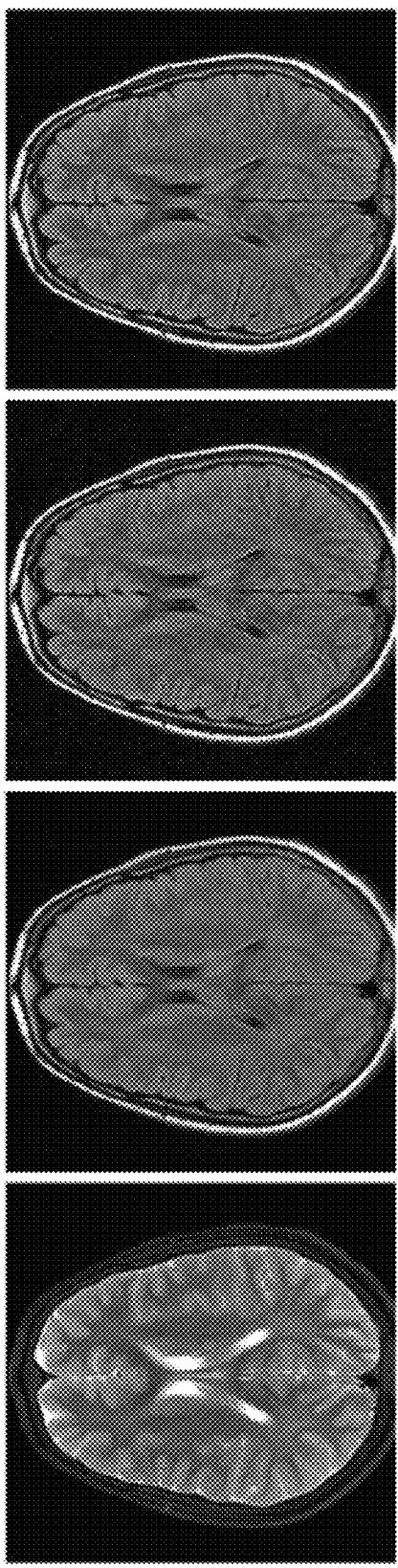
FIGS. 3A-D show multiple scanned MRI slices, and reconstruction results using similarity between T2 and FLAIR contrasts, in accordance with an embodiment.

Reference is made to FIGS. 3A-D which show reference based MRI used within the same scan, and reconstruction results utilizing similarity between T2 and FLAIR contrasts. FIG. 3A shows the fully sampled T2-weighted image, and FIG. 3B shows the FLAIR image, FIG. 3C shows a reconstruction based on sparsity in wavelet domain only, and FIG. 3D shows a reference based reconstruction using binary values for $W_2$ (representing fluid/non fluid regions). It can clearly be seen that reference-based FLAIR reconstruction outperforms traditional wavelet sparsity based FLAIR reconstruction, using only 15% of the data. The similarity between T2 and FLAIR in regions with low fluid concentration (FIGS. 3A-B) is utilized for high quality reconstruction from 15% of k-space FLAIR data (FIG. 3D). State-of-the-art wavelet based reconstruction using the same data results in imaging artifacts (FIG. 3C).

2. Utilizing Similarity Between Baseline of Follow-Up Scans

Repeated brain MRI scans of the same patient every few weeks or months are very common for follow-up of brain tumors. The goal here is to use a previous scan in the time series as a reference scan for reconstruction of a follow-up scan. In this application some practical problems need to be tackled, such as grey-level variations and miss-registration between scans acquired at different dates. While these obstacles are discussed below, similarity between the reference and current scans is not still not guaranteed (e.g. due to pathology changes), and prior information on spatial regions that may exhibit differences is not available.

Therefore, in this case, the features described above with respect to Equation (3) and Algorithm 1 were used to estimate $W_1$ and $W_2$ in an iterative manner. Since all samples where acquired with similar SNR, A was set to A=I.

Figures 4A, 4B, 4C, 4D:
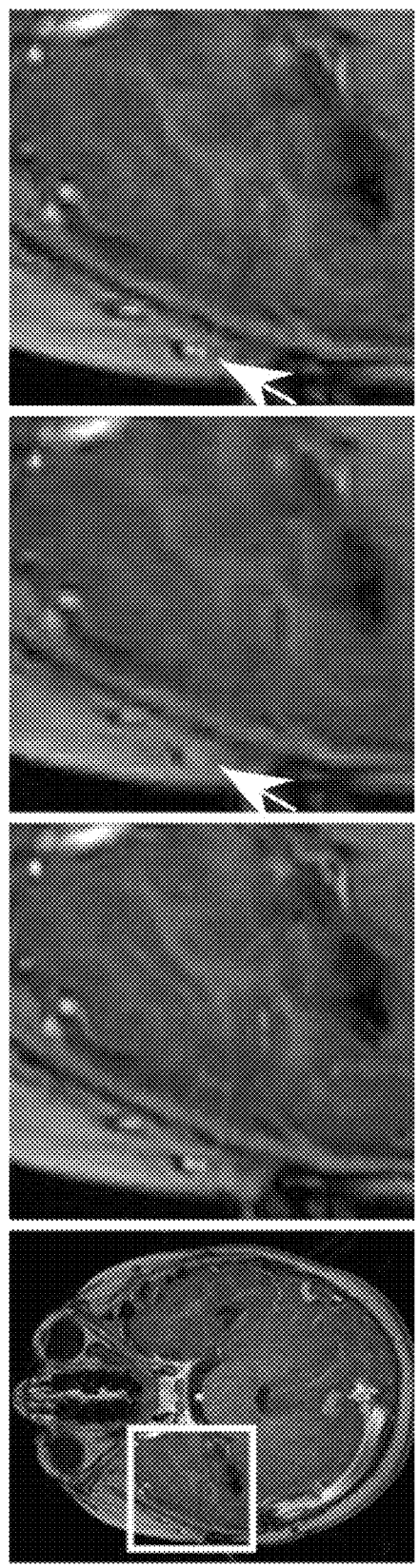
FIGS. 4A-D, show multiple scanned MRI slices using 6% of k-space data, and reconstruction results, in accordance with an embodiment.

Reference is now made to FIGS. 4A-D, which show reference-based MRI used in longitudinal studies illustrating reconstruction results from 6% of k-space data. The reconstruction results of a follow-up T1-weighted brain scan utilizing the baseline scan as a reference scan (resolution: 0.5×0.5 mm$^2$, thickness: 1 mm for both scans) is shown. Results were obtained using only 6% of k-space data. It can be seen that the reference based method exhibits imaging features that are hardly visible in the wavelet based reconstruction method. The superiority of the reference based approach may be attributed to the iterative mechanism that adapts the reconstruction during to match actual similarity. FIG. 4B shows an enlarged, or zoomed-in view of the marked region in FIG. 4A, FIG. 4C shows a corresponding zoomed-in view of the results of a wavelet-based reconstruction, and FIG. 4D shows a corresponding zoomed-in view of the results of a reference-based reconstruction. It can be readily seen that the reference-based approach (FIG. 4D) exhibits results which are very similar to the gold standard (FIG. 4B), and reveals imaging features that are not visible in state-of-the-art wavelet based MRI reconstruction (FIG. 4C).

3. Utilizing Similarity Between Adjacent Slices

In this application, the extension of fast reference based MRI to improve SNR of thin MRI slices, detailed with respect to equation (4) was examined. A brain T2-weighted scan with slice thickness in the order of 0.8 millimeters (mm) was acquired, followed by an additional acquisition with a slice of thickness in the order of 1.6 mm. In all scans, a single repetition was used and the in-plane resolution was in the order of 0.8×0.8 mm$^2$. As a result a low SNR scan consisting of thin slices, and high SNR scan consisting of thick slices where each thick slice overlaps two thin slices was obtained. A high SNR scan comprised of thin slices was reconstructed from this data.

Referring to FIGS. 5A-H, which show thin slices at various SNR levels, and the corresponding reconstruction results. The reconstruction was performed from from low SNR data using the reference-based MRI method described above, within the same imaging contrast. Figure pairs 5A-B, 5C-D, and 5E-F show pairs of adjacent thin T2-weighted slices that were acquired with one, two and four repetitions, respectively. A high similarity exists within each pair, which may be exploited to improve SNR. It can be seen that at least four repetitions are generally required for adequate SNR. Figure pair 5G-H shows the results of the reference-based method described above, that was obtained by exploiting the similarity between acquired FIGS. 5A-B with a high SNR thick slice (not shown). It can be seen that SNR is significantly improved and comparable to the images acquired using four repetitions (FIGS. 5C-D).

In terms of scanning time, four repetitions were required to obtain thin slices with SNR comparable to SNR of data reconstructed with the method described herein. Therefore, without additional acceleration approaches (parallel imaging etc.), the reference-based approach requires one scan for each of three slices, as opposed to four scans for each of two slices using conventional scanning, yielding a speed-up factor of 2.6 for the present approach.

Parameter Sensitivity Analysis

In this analysis, the sensitivity of reference-based MRI was examined with respect to changes in parameters, and quantitative measures for the experiential results are provided. The peak signal-to-noise ratio (PSNR) results of each experiment for various values of $\lambda_1$ and $\lambda_2$ are examine. In this analysis, PSNR is defined as: PSNR=10 $\log_{10}(M^2/V_s)$, where M denotes the maximum possible pixel value in the image and $V_s$ is the Mean Square Error (MSE) between the original image, x and the reconstructed image, $\hat{x}$.

Figure 6C:
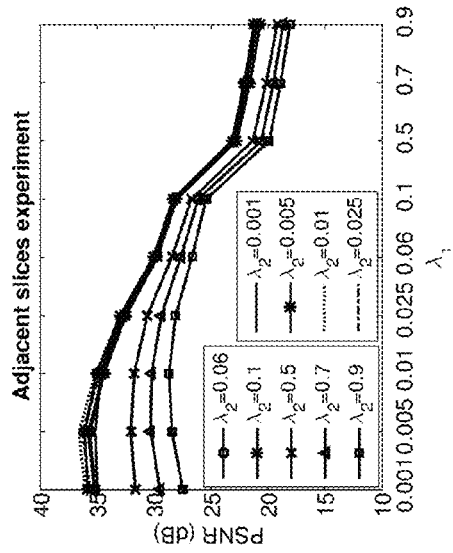
FIGS. 6A-C show sensitivity analysis of peak-signal-to-noise (PSNR) results for various weight-controlling parameter values $\lambda_1$ and $\lambda_2$.
Figure 6B:
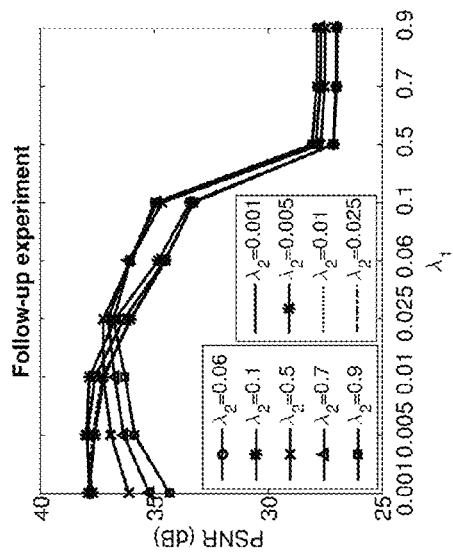
Figure 6A:
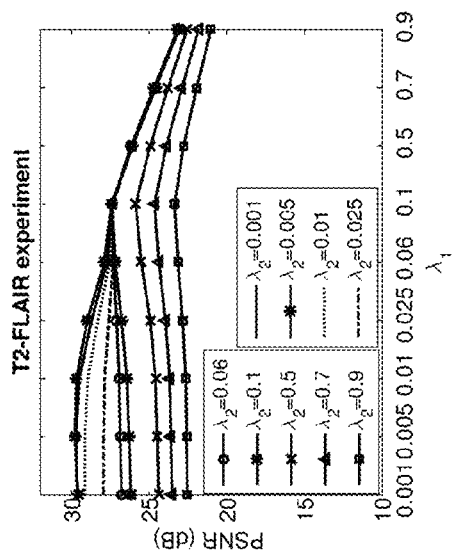

FIGS. 6A-C show the PSNR sensitivity analysis results of similarity applications for various values of $\lambda_1$ and $\lambda_2$. FIG. 6A shows PSNR results of T2-FLAIR, FIG. 6B shows PSNR measured for a follow-up experiment, and FIG. 6C shows PSNR measured for adjacent MRI slices. It can be seen that values for $\lambda_1$, $\lambda_2$ ∈[0.001,0.005] yield high PSNR, regardless of the specific application. This may indicate an optimal range of values for these parameters and obviate the need for optimization in future applications of reference-based MRI.

The values shown for the the adjacent slices experiment are were averaged over the two thin slices used in the experiment. Generally, we can say that lower values of $\lambda_1$ and $\lambda_2$ (<0.1) provide better PSNR than higher ones. This can be explained by the fact that over-promoting sparsity versus consistency to measurement degrades the reconstruction quality. In addition, we see that the T2-FLAIR experiment provides a lower range of PSNR values in comparison to other experiments. This can be explained by the fact that similarity is not enforced over the entire image in this case, due to many regions of differences between FLAIR and T2. As a result, PSNR is lower in comparison to other experiments due to weaker prior.

Thus, in conclusion, a general approach is formulated that can be applied for a variety of MRI applications, using different types of reference images. Moreover, there is no prior assumption of similarity to a reference scan; when there is no similarity to the reference scan, the results converge to conventional CS-MRI.

Optionally, information from multiple reference images may be used. For example, the method may be extended to support similarity between multiple imaging contrasts in the same scan or to embed information from multiple scans to speed up longitudinal scanning. Extending the above algorithms to support M reference images, $x_{ref}=[x_1^T, \ldots, x_M^T]^T$ can be performed by defining $$x_R = [\underbrace{x^T, \ldots, x^T}_{M \text{ times}}]^T$$

and modifying equation (4) as follows:

$$\min_x \|A(F_u x - y)\|_2^2 + \lambda_1 \|W_1 \Psi x\|_1 + \lambda_2 \|W_2 E(x_R - x_{ref})\|_1 \quad (9)$$

where $E_i$ is a diagonal matrix, and $$E = \text{diag}\left(\left[\underbrace{e^{j\frac{2\pi}{M}0}, \ldots, e^{j\frac{2\pi}{M}0}}_{N \text{ times}}, \ldots, \underbrace{e^{j\frac{2\pi}{M}(M-1)}, \ldots, e^{j\frac{2\pi}{M}(M-1)}}_{N \text{ times}}\right]\right) \quad (10)$$

In this manner, each reference scan equally contributes to the minimization problem.

Additionally, prior knowledge based on user input regarding the level of similarity to the reference scan may be used. For example, in the follow-up MRI application, the user may annotate the pathology region as an evolving region, that is likely to exhibit a low level of similarity. As a result, the estimation of the weighting matrices may be improved, leading to improved image reconstruction.

In one embodiment, the grey-level intensities of the reference scan and acquired scans may be normalized and realigned after acquisition, to account for spatially misalignment and different ranges of grey-level intensities. Since the data is acquired prior to reconstruction, a wavelet based reconstruction using all acquired samples may be performed first. Although wavelet-based reconstruction may exhibit inadequate reconstruction of fine details, as presented in the experimental results above, it may used in a first step for grey-level normalization and alignment in order to extract the parameters. Thus extracted, the parameters may be used for normalization and realignment of the data in the reference-based MRI method, applied in a second step, for improved reconstruction performance.

It may be noted that if the iterative approach detects a low similarity between the scans, such as when the alignment and/or normalization are insufficient, the reconstruction result will converge to a wavelet-based reconstruction.

The iterative reconstruction approach for reference-based MRI that supports cases where similarity to the reference scan is not guaranteed has been demonstrated in the three experimental clinical MRI applications described above, including reconstruction from noisy images and from under-sampled k-space data. As may be seen, the results exhibit an improvement over wavelet sparsity based MRI.

This offers advantages over other CS-MRI-based approaches that consist of k-space undersampling, and require sequence programming that may delay their penetration to the clinical environment. Moreover, in many cases sequence programmers have to compromise on sub-optimal undersampling patterns, since optimal ones cannot be physically implemented in a real MRI scanner.

While two of the applications presented herein are also based on k-space undersampling, the SNR improvement application requires no undersampling in the k-space domain. Rather, it is based on images acquired with fewer repetitions than conventional ones. Therefore, it requires no pulse sequence programming and can be applied for standard pulse sequences, as are used today in many clinics. Unlike undersampling-based approaches, this implementation has the potential for smooth and fast penetration into the clinical environment. This approach can improve reconstruction in many MR applications.

The present invention may be a system, a method, and/or a computer program product. The computer program product may include a computer readable storage medium (or media) having computer readable program instructions thereon for causing a processor to carry out aspects of the present invention.

The computer readable storage medium can be a non-transitory, tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention may be described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terms "approximately", "about", "in the order of", "substantially" or the like, when relating to a numerical value, are meant to denote a range of ±15% from the value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for reconstructing high signal-to-noise ratio (SNR) magnetic resonance imaging (MRI) slices, comprising:
   receiving a thick MRI slice of bodily tissue acquired using a single MRI scan, wherein the thick slice has a high SNR;
   receiving two thin MRI slices of the bodily tissue acquired using a single MRI scan, wherein each of the two thin MRI slices has a low SNR; and
   reconstructing multiple high SNR thin slices of the bodily tissue using the thick slice and the two thin slices;
   wherein reconstructing comprises assigning higher weights to elements corresponding to the thick MRI slice and lower weights to elements corresponding to the thin MRI slices, thereby prioritizing acquired MRI slices having high SNR.

2. The method of claim 1, wherein the thick MRI slice overlaps each of the two thin MRI slices.

3. The method of claim 2, wherein the two thin MRI slices are adjacent.

4. The method of claim 1, wherein the bodily tissue is a brain.

5. The method of claim 1, wherein the thin slices each has a thickness in the order of 0.8 millimeters, and the thick slice has a thickness in the order of 1.6 millimeters, and wherein an in-plane resolution of the acquisitions is in the order of 0.8 by 0.8 millimeters squared.

6. The method of claim 1, wherein the weights are determined in real-time while acquiring the thick and thin MRI slices.

7. The method of claim 1, wherein the weights enforce a sparsity on the differences between the thin MRI slices.

8. The method of claim 1, wherein acquiring the thick slice and the two thin slices comprises sampling over an entire spatial transform corresponding to the bodily tissue.

9. The method of claim 1, wherein reconstructing comprises enforcing a similarity attribute between the thick slice and an average of the two thin slices.

10. The method of claim 1, wherein reconstructing optimizing one or more parameters of an $l_1$ minimization problem corresponding to reconstructing the high SNR thin slices.

11. The method of claim 1, further comprising rendering the reconstructed SNR thin slices on a display monitor.

12. A system for reconstructing high signal-to-noise ratio (SNR) magnetic resonance imaging (MRI) slices, comprising:
   an MRI imaging system; and
   a processor, wherein the processor is configured to
   receive a thick MRI slice of bodily tissue acquired using a single scan by the MRI imaging system, wherein the thick slice has a high SNR;
   receive two thin MRI slices of the bodily tissue acquired using a single scan by the MRI imaging system, wherein each of the two thin MRI slices has a low SNR; and
   reconstruct multiple high SNR thin slices of the bodily tissue using the thick slice and the two thin slices;
   wherein reconstructing comprises assigning higher weights to elements corresponding to the thick MRI slice and lower weights to elements corresponding to the thin MRI slices, thereby prioritizing acquired MRI slices having high SNR.

13. The system of claim 12, further comprising a display monitor configured to display the reconstructed multiple high SNR thin slices.

14. The system of claim 12, wherein the thick MRI slice overlaps each of the two thin MRI slices.

15. The system of claim 14, wherein the two thin MRI slices are adjacent.

16. The system of claim 12, wherein the bodily tissue is a brain.

17. The system of claim 12, wherein the thin slices each has a thickness in the order of 0.8 millimeters, and the thick slice has a thickness in the order of 1.6 millimeters, and wherein an in-plane resolution of the acquisitions is in the order of 0.8 by 0.8 millimeters squared.

18. The system of claim 12, wherein the weights are determined in real-time while acquiring the thick and thin MRI slices.

19. The system of claim 12, wherein the weights enforce a sparsity on the differences between the thin MRI slices.

20. The system of claim 12, wherein acquiring the thick slice and the two thin slices comprises sampling over an entire spatial transform corresponding to the bodily tissue.

21. The system of claim 12, wherein reconstructing comprises enforcing a similarity attribute between the thick slice and an average of the two thin slices.

22. The system of claim 12, wherein reconstructing optimizing one or more parameters of an $l_1$ minimization problem corresponding to reconstructing the high SNR thin slices.

23. A computer program product comprising a non-transitory computer-readable storage medium having program code embodied thereon, the program code executable by at least one hardware processor to:
   receive a thick MRI slice of bodily tissue acquired using a single MRI scan, wherein the thick slice has a high SNR;
   receive two thin MRI slices of the bodily tissue acquired using a single MRI scan, wherein each of the two thin MRI slices has a low SNR; and
   reconstruct multiple high SNR thin slices of the bodily tissue using the thick slice and the two thin slices;
   wherein reconstructing comprises assigning higher weights to elements corresponding to the thick MRI slice and lower weights to elements corresponding to the thin MRI slices, thereby prioritizing acquired MRI slices having high SNR.

24. The computer program product of claim 23, wherein the thick MRI slice overlaps each of the two thin MRI slices.

25. The computer program product of claim 24, wherein the two thin MRI slices are adjacent.

26. The computer program product of claim 25, wherein the bodily tissue is a brain.

27. The computer program product of claim 25, wherein the thin slices each has a thickness in the order of 0.8 millimeters, and the thick slice has a thickness in the order of 1.6 millimeters, and wherein an in-plane resolution of the acquisitions is in the order of 0.8 by 0.8 millimeters squared.

28. The computer program product of claim 25, wherein the weights are determined in real-time while acquiring the thick and thin MRI slices.

29. The computer program product of claim 25, wherein the weights enforce a sparsity on the differences between the thin MRI slices.

30. The computer program product of claim 25, wherein acquiring the thick slice and the two thin slices comprises sampling over an entire spatial transform corresponding to the bodily tissue.

31. The computer program product of claim 25, wherein reconstructing comprises enforcing a similarity attribute between the thick slice and an average of the two thin slices.

32. The computer program product of claim 25, wherein reconstructing optimizing one or more parameters of an $l_1$ minimization problem corresponding to reconstructing the high SNR thin slices.

33. The computer program product of claim 25, wherein the program code is further executable for rendering the reconstructed SNR thin slices on a display monitor.

* * * * *